(12) United States Patent
Jain et al.

(10) Patent No.: US 9,899,375 B1
(45) Date of Patent: Feb. 20, 2018

(54) CO-INTEGRATION OF SELF-ALIGNED AND NON-SELF ALIGNED HETEROJUNCTION BIPOLAR TRANSISTORS (71) Applicant: GLOBALFOUNDRIES INC., Grand Cayman (KY)

(72) Inventors: Vibhor Jain, Essex Junction, VT (US); Qizhi Liu, Lexington, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/226,575

(22) Filed: Aug. 2, 2016

(51) Int. Cl.
| H01L 29/737 | (2006.01) |
| H01L 27/082 | (2006.01) |
| H01L 23/66 | (2006.01) |
| H01L 29/165 | (2006.01) |
| H01L 21/8222 | (2006.01) |
| H01L 29/08 | (2006.01) |
| H01L 29/06 | (2006.01) |
| H01L 21/3065 | (2006.01) |
| H01L 21/306 | (2006.01) |
| H03F 3/195 | (2006.01) |
| H03F 3/213 | (2006.01) |

(52) U.S. Cl.
CPC ...... *H01L 27/0823* (2013.01); *H01L 21/3065* (2013.01); *H01L 21/30625* (2013.01); *H01L 21/8222* (2013.01); *H01L 23/66* (2013.01); *H01L 29/0649* (2013.01); *H01L 29/0817* (2013.01); *H01L 29/165* (2013.01); *H03F 3/195* (2013.01); *H03F 3/213* (2013.01); *H03F 2200/294* (2013.01)

(58) Field of Classification Search
None
See application file for complete search history.

(56) References Cited

U.S. PATENT DOCUMENTS

| 5,323,032 | A | * | 6/1994 | Sato | H01L 29/7378 257/198 |
| 5,446,294 | A | * | 8/1995 | Bayraktaroglu | H01L 29/1004 257/198 |
| 7,217,628 | B2 | | 5/2007 | Sheridan et al. | |
| 7,855,404 | B2 | | 12/2010 | Heinenman et al. | |
| 8,035,167 | B2 | | 10/2011 | Knoll et al. | |
| 8,450,179 | B2 | | 5/2013 | El-Kareh et al. | |
| 8,603,885 | B2 | | 12/2013 | Malladi et al. | |
| 2002/0070410 | A1 | * | 6/2002 | Freeman | H01L 21/8222 257/370 |
| 2015/0303187 | A1 | * | 10/2015 | Preisler | H01L 27/0623 257/370 |

OTHER PUBLICATIONS

Specification and Drawings for U.S. Appl. No. 14/965,267, filed Dec. 10, 2015, 25 pages.

* cited by examiner

*Primary Examiner* — Sitaramarao S Yechuri
(74) *Attorney, Agent, or Firm* — Michael LeStrange; Andrew M. Calderon; Roberts Mlotkowski Safran Cole & Calderon, P.C.

(57) ABSTRACT

The present disclosure relates to semiconductor structures and, more particularly, to co-integration of self-aligned and non-self aligned heterojunction bipolar transistors and methods of manufacture. The structure includes at least two heterojunction bipolar transistor (HBT) devices integrated onto a same wafer with different epitaxial base profiles. An intrinsic base epitaxy for a second device of the at least two HBT devices acts as an extrinsic base for a first device of the at least two HBT devices.

19 Claims, 5 Drawing Sheets

CO-INTEGRATION OF SELF-ALIGNED AND NON-SELF ALIGNED HETEROJUNCTION BIPOLAR TRANSISTORS

FIELD OF THE INVENTION

The present disclosure relates to semiconductor structures and, more particularly, to co-integration of self-aligned and non-self aligned heterojunction bipolar transistors and methods of manufacture.

BACKGROUND

A heterojunction bipolar transistor (HBT) is a type of bipolar junction transistor (BJT) which uses differing semiconductor materials for the emitter and base regions, or base and collector regions, thereby creating a heterojunction. The HBT can handle signals of very high frequencies, up to several hundred GHz. The HBT is commonly used in radio-frequency (RF) systems, and in applications requiring a high power efficiency, such as RF power amplifiers in cellular phones.

BiCMOS technologies with very good low-noise amplifier (LNA) and very good power amplifier (PA) SiGe HBTs are difficult to integrate on the same wafer due to different optimization requirements. For example, LNA devices need high current gain beta, low Rb (base resistance) and low Ccb (collector-base capacitance) for low Noise Figure (NF) and high gain. A self-aligned emitter/base integration scheme is preferred for the LNA as it results in both lower Rb and lower Ccb. In LNA technologies, an implanted extrinsic base structure is typically used which results in high Rb and high base current (low beta). On the other hand, the PA devices need low Cbe (base-emitter capacitance) and high BVceo (for a given beta). In such PA implementations, a wide emitter is required and self-alignment of emitter-base is not essential. Accordingly, in current integration schemes, only one device can be optimized for performance, with the performance of the other device mostly restricted.

SUMMARY

In an aspect of the disclosure, a structure comprises at least two heterojunction bipolar transistor (HBT) devices integrated onto a same wafer with different epitaxial base profiles. An intrinsic base epitaxy for a second device of the at least two HBT devices acts as an extrinsic base for a first device of the at least two HBT devices.

In an aspect of the disclosure, a structure comprises: a first heterojunction bipolar transistor (HBT) device formed on a substrate and a second HBT device formed on the substrate. The first HBT device comprises: a collector region formed from the substrate; a self-aligned epitaxial base having a first profile formed in an opening above the collector region; and a self-aligned emitter region adjacent to the epitaxial base with the first profile. The second HBT device comprises: a collector region formed from the substrate; an epitaxial base having a second profile different than the first profile, which is formed in an opening above the collector region; and an emitter region adjacent to the epitaxial base with the second profile.

In an aspect of the disclosure, a method comprises: growing a first SiGe base with non-selective epitaxy for a first device; growing a second SiGe base for a second device, the first SiGe base and the second SiGe base having a different base profile; forming an emitter window and an undercut for the first device over the first SiGe base; linking an extrinsic base to an intrinsic base for first device within the undercut; forming an emitter window for the second device; and forming an emitter for both the first device and the second device, simultaneously.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to co-integration of self-aligned and non-self aligned heterojunction bipolar transistors and methods of manufacture. More specifically, the present disclosure provides an integration scheme to optimize two NPN devices, e.g., low-noise amplifier (LNA) and power amplifier (PA) devices. In embodiments, for example, the LNA and PA devices have optimized SiGe base profiles. In addition to optimizing SiGe base profiles for the PA and LNA, the integration scheme (i.e., emitter/base integration scheme) is also optimized specifically for the LNA and PA devices according to their specific needs. The integration scheme described herein is also applicable for other applications, e.g., high fT and high fmax devices or PA devices and high performance (HP) devices, amongst others. HP devices typically have very high ft/fmax for automotive radars, optical communication applications, etc.

In more specific embodiments, two HBT devices are integrated on a same wafer with two different SiGe epitaxy base profiles and two different integration schemes. For example, an intrinsic base epitaxy for one device can act as an extrinsic base poly for a second device. More specifically, in embodiments, dual-optimization can result from the use of non-selective epitaxy as part of the raised extrinsic base layer for the LNA device. In embodiments, the epitaxial profiles could differ in doping, thickness and Ge content in the base, as examples. The devices can also have the same emitter (formed simultaneously) and same or different collectors. In addition, one HBT (e.g., LNA device) can have a self-aligned emitter/base integration, whereas, another HBT (e.g., PA device) can have a non-self-aligned emitter/base integration.

The dual integration scheme of the present disclosure can be manufactured in a number of ways using a number of different tools. In general, though, the methodologies and tools are used to form structures with dimensions in the micrometer and nanometer scale. The methodologies, i.e., technologies, employed to manufacture the dual integration scheme of the present disclosure have been adopted from integrated circuit (IC) technology. For example, the structures are built on wafers and are realized in films of material patterned by photolithographic processes on the top of a wafer. In particular, the fabrication of the dual integration scheme uses three basic building blocks: (i) deposition of thin films of material on a substrate, (ii) applying a patterned mask on top of the films by photolithographic imaging, and (iii) etching the films selectively to the mask.

Figure 1:
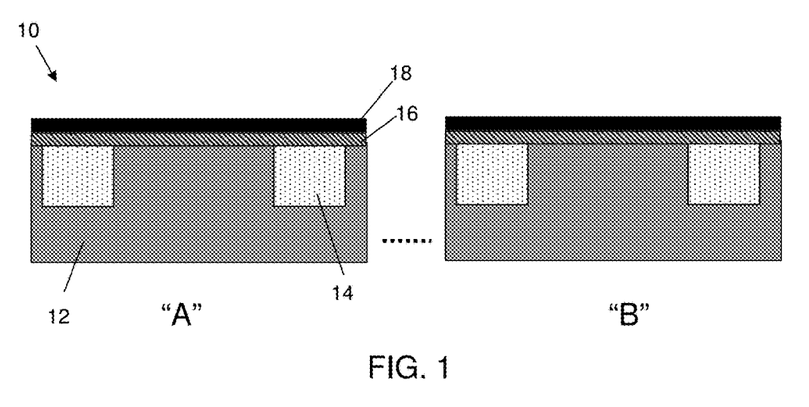
FIG. 1 shows a starting structure and respective fabrication processes in accordance with aspects of the present disclosure.

FIG. 1 shows a structure and respective fabrication processes in accordance with aspects of the present disclosure. As with all of the figures shown herein, the integration scheme shows a fabrication process for both an LNA device (on side "A") and a PA device (on side "B") in accordance with aspects of the present disclosure. It should be recognized by those of skill in the art that other devices are also contemplated using the integration schemes described herein.

In embodiments, the structure 10 includes shallow trench isolation (STI) structures 14 formed in a substrate 12. In embodiments, the substrate 12 can be Si, silicon-on-insulator (SOI) or SiC, for examples. The area of the substrate 12 between the STI structures 14 can form the collector region of the HBTs, e.g., LNA device and PA device. In embodiments, a collector implant might be same between the devices. To form the STI structures 14, for example, a resist is formed over the substrate 12 and exposed to energy (light) to form openings that correspond with the STI structures 14. A trench is formed in the substrate 12 through the openings, by conventional etching processes, e.g., reactive ion etching (RIE). The resist is removed by a conventional stripant or oxygen ashing and an oxide material is then deposited in the trench, followed by a chemical mechanical polish (CMP).

Still referring to FIG. 1, an oxide material 16 is formed over the STI structures 14 and exposed surfaces of the substrate 12. In embodiments, the oxide material 16 can be deposited by a conventional chemical vapor deposition (CVD) process to a thickness of about 100 Å to about 400 Å; although other thicknesses are also contemplated herein. A poly material 18 is deposited over the oxide material 16. In embodiments, the poly material 18 can be deposited by a conventional CVD process to a thickness of about 100 Å to about 400 Å; although other thicknesses are also contemplated herein.

Figure 2:
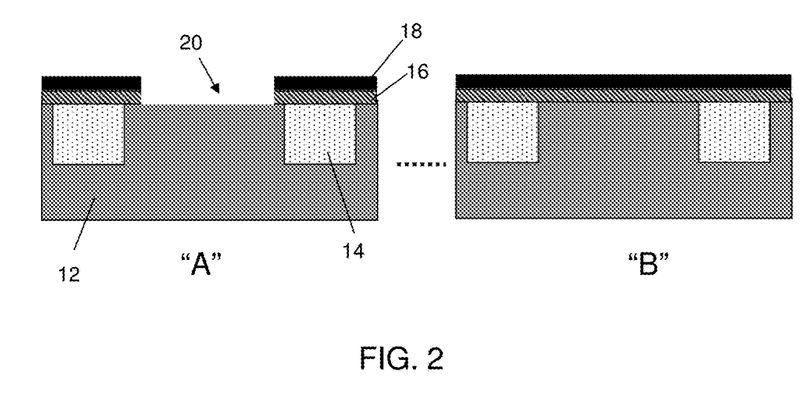
FIG. 2 shows an opening for a base region of a first device and respective fabrication processes in accordance with aspects of the present disclosure.

In FIG. 2, a window or opening 20 is formed through the oxide material 16 and the poly material 18 on the LNA side of the device, e.g., side "A", to expose a surface of the underlying substrate 12. In embodiments, the opening 20 is fabricated by forming a mask or resist on the poly material 18 and exposing it to energy to form an opening, followed by an etching (RIE) process to remove the oxide material 16 and the poly material 18 on the LNA side of the device. The resist can then be removed by a conventional stripant or oxygen ashing process. As shown in FIG. 2, the PA side of the device (e.g., side "B") will not undergo any etching processes, as it remains protected by the resist.

Figure 3:
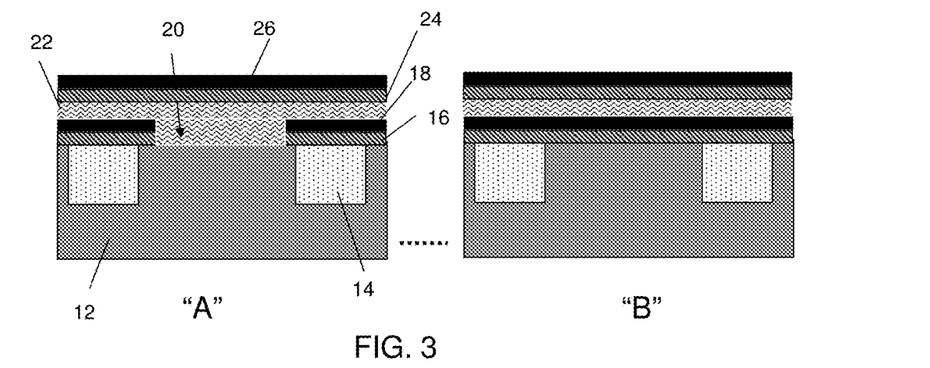
FIG. 3 shows a base material within the opening in addition to several further material layers and respective fabrication processes in accordance with aspects of the present disclosure.

In FIG. 3, a low temperature epitaxial material 22 is formed within the opening 20 (on the exposed surface of the substrate 12) and the exposed surfaces of the poly material 18 on both the LNA side and the PA side of the substrate. As should be understood by those of ordinary skill in the art, the low temperature epitaxial material 22 is a non-selective material that will grow as single crystalline SiGe on the substrate 12 on the LNA side of the device (e.g., side "A"); whereas, the low temperature epitaxial material 22 will grow as poly-crystalline or amorphous material on the surface of the poly material 18 and any dielectric material. In embodiments, the low temperature epitaxial material 22 can be other semiconductor materials known to those of skill in the art. The low temperature epitaxial material 22 can be grown to a thickness of about 300 Å to about 3000 Å; although other thicknesses are also contemplated by the present disclosure.

In embodiments, the SiGe material 22 will form a base region for the LNA device, which can be optimized. For example, the SiGe material 22 can have different concentrations of Ge to obtain a particular beta, e.g., high beta. For example, Ge concentration can be can be anywhere between about 5%-40%. In addition or alternatively, the SiGe material 22 can have a high base dopant in order to provide a low base resistance for the LNA device. For example, base Boron doping can be as high as $5E^{20}/cm^3$ Still referring to FIG. 3, in embodiments, an oxide material 24 and poly material 26 are sequentially deposited over the low temperature epitaxial material 22, e.g., both single crystal SiGe and poly material. In embodiments, the oxide material 24 and poly material 26 are each deposited separately by a conventional deposition process, e.g., CVD. The oxide material 24 and poly material 26 can each be deposited to a thickness of about 200 Å; although other thicknesses are also contemplated herein.

Figure 4:
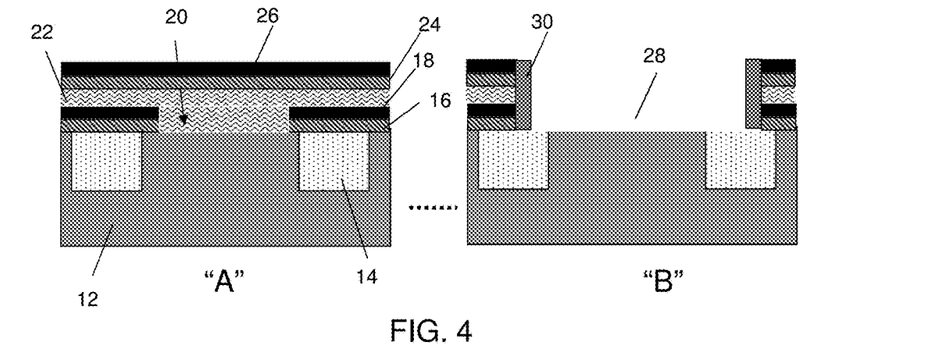
FIG. 4 shows a base opening and spacer formation for a base region of a second device and respective fabrication processes in accordance with aspects of the present disclosure.

Referring to FIG. 4, an opening 28 is formed in the base area on the PA side (e.g., side "B"). In embodiments, the opening 28 is formed by conventional lithography and etching processes, as described herein, to expose a surface of the substrate 12. In embodiments, the LNA side of the substrate (e.g., side "A") remains protected with the resist during the formation of the opening 28. Optional spacers 30 are formed on the sidewalls of the opening 28. In embodiments, the spacers 30 are nitride material formed by a conventional conformal deposition process, followed by an anisotropic etching process to remove spacer material from the horizontal surfaces.

Figure 5:
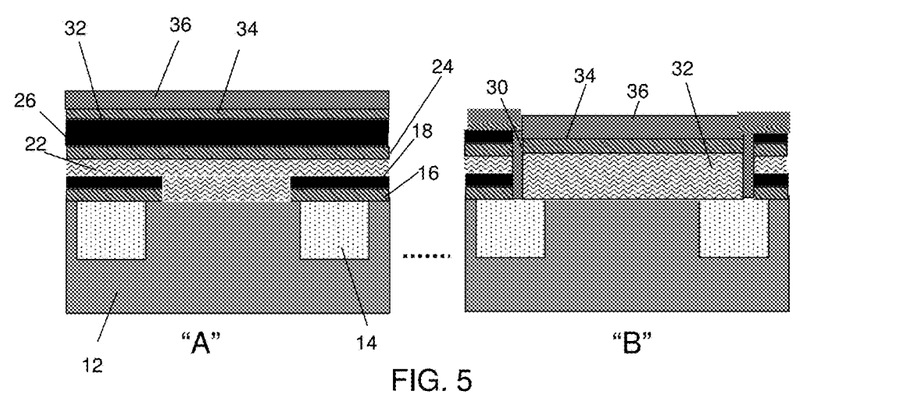
FIG. 5 shows a base material within the opening for the second device, in addition to several further layers and respective fabrication processes in accordance with aspects of the present disclosure.

In FIG. 5, a low temperature epitaxial material 32 is formed within the opening 30 (on the exposed surface of the substrate 12) and the exposed surfaces of the poly material 26 on both the LNA side and the PA side of the substrate. As previously noted, the low temperature epitaxial material 32 is a non-selective material that will grow as single crystal semiconductor material on the substrate 12; whereas, the low temperature epitaxial material 32 will grow as poly-crystalline or amorphous material on the surface of the poly material and any dielectric material, e.g., oxide material of the exposed STI region 14. In this way, the intrinsic base epitaxy for the second device (e.g., PA device) acts as an extrinsic poly base for the first device (e.g., the LNA device). In embodiments, the low temperature epitaxial material 32 can be other semiconductor materials.

In embodiments, the SiGe material 32 will form a base region for the PA device, which can be optimized for low capacitance and high breakdown voltage. For example, the SiGe (semiconductor) material 32 can have different concentrations of Ge to obtain a particular beta for high BVceo. In addition or alternatively, the SiGe material 32 can have a base dopant or concentration in order to provide a low base and/or emitter capacitance for the PA device, as well as different thicknesses to adjust the breakdown voltage. For example, Ge concentration in the SiGe for the PA can be anywhere from about 5% to 25% and the base dopant for the NPN structure can be Boron with concentration as high as $2E^{20}/cm^3$. Moreover, as an example, the low temperature epitaxial material 32 can be thicker layer than the material 22 of the LNA device, e.g., grown to a thickness of greater than 300 Å to about 3000 Å, to increase the breakdown voltage. In this way, it is now possible to integrate at least two HBT devices onto a same wafer with different epitaxial base profiles. Also, the non-selective epitaxy, e.g., low temperature epitaxial material 32, can be used as part of the raised extrinsic base layer for the LNA device.

Still referring to FIG. 5, in embodiments, an oxide material 34 and nitride material 36 are sequentially deposited over the low temperature epitaxial material 32, e.g., both single crystal SiGe and poly material. In embodiments, the oxide material 34 and nitride material 36 are each deposited separately by a conventional deposition process, e.g., CVD. The oxide material 34 and nitride material 36 can each be deposited to a thickness of about 200 Å; although other thicknesses are also contemplated herein. In embodiments, the layers 34 and 36 can be of same thickness over both "A" and "B". Also layers 34 and 36 can be deposited over the entire structure shown on side "B" including regions outside spacer 30.

Figure 6:
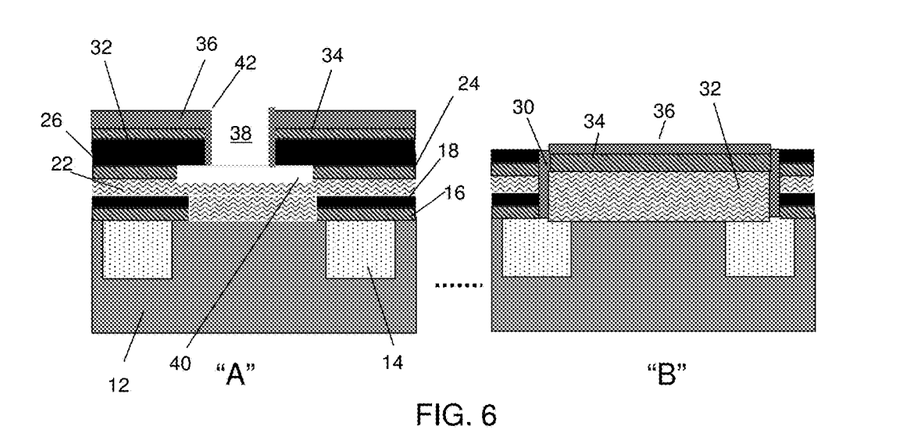
FIG. 6 shows an emitter opening and undercut for the first device and respective fabrication processes in accordance with aspects of the present disclosure.

As shown in FIG. 6, an emitter window or opening 38 is formed on the LNA side of the structure, e.g., side "A". In embodiments, the emitter window or opening 38 is formed by conventional lithography and etching processes, e.g., RIE, with the oxide material 24 acting as an etch stop layer. The PA side of the structure, e.g., side "B" remains protected by a resist or mask material during the etching process. In embodiments, an emitter spacer 42 is formed on sidewalls of the emitter window or opening 38. The emitter spacer 42 can be formed after removal of the resist material. In embodiments, the emitter spacer 42 is a nitride material formed by a conformal deposition process, followed by an anisotropic etching process to remove the emitter material from horizontal surfaces of the structure.

Following formation of the emitter spacer 42, an undercut 40 can be formed in the oxide material 24, aligned with the emitter window or opening 38. The undercut 40 can be formed by a wet etching process of the oxide material 24 to expose the underlying semiconductor material 22, e.g., low temperature epitaxial material. Depending on the etch time, for example, the undercut 40 can have different dimensions, e.g., ranging from about 500 Å to about 3000 Å.

Figure 7:
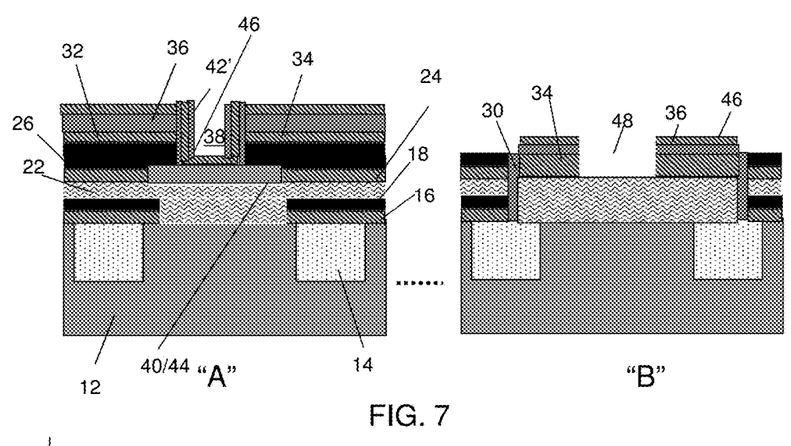
FIG. 7 shows sidewall spacer formation and a growth in the opening of the first device, and an emitter opening for the second device in accordance with aspects of the present disclosure.

Referring now to FIG. 7, semiconductor material 44, e.g., Si material, is formed in the undercut 40 by a selective epitaxial growth process to link the raised extrinsic base to the intrinsic base on the LNA region of the structure, e.g., side "A". As should be understood by those of skill in the art, the semiconductor material 44 will grow on the exposed surface of the low temperature epitaxial material 22 (e.g., SiGe), filling the undercut 40. Also, as should be understood by those of skill in the art, the semiconductor material 44 will not grow on nitride material 36 formed on upper surfaces of both the LNA region and PA region of the structure due to selective growth conditions. Moreover, the oxide layer between the extrinsic base and the intrinsic base reduces the Ccb for the device resulting in higher gain.

As further shown in FIG. 7, after formation of the semiconductor material 44, oxide material 46 and additional nitride material is blanket deposited on the structure and, in particular, over the semiconductor material 44. The nitride material will extend the emitter spacer 42 to the semiconductor material 44. The nitride material will undergo an anisotropic etching process to form another spacer 42' and to remove any excess material from horizontal surfaces of the structure.

Still referring to FIG. 7, an emitter window or opening 48 is formed on the PA side of the structure, e.g., side "B", using conventional lithography and etching processes, e.g., RIE, as already described herein. The emitter window or opening 48 will expose a surface of the low temperature epitaxial material 32.

Figure 8:
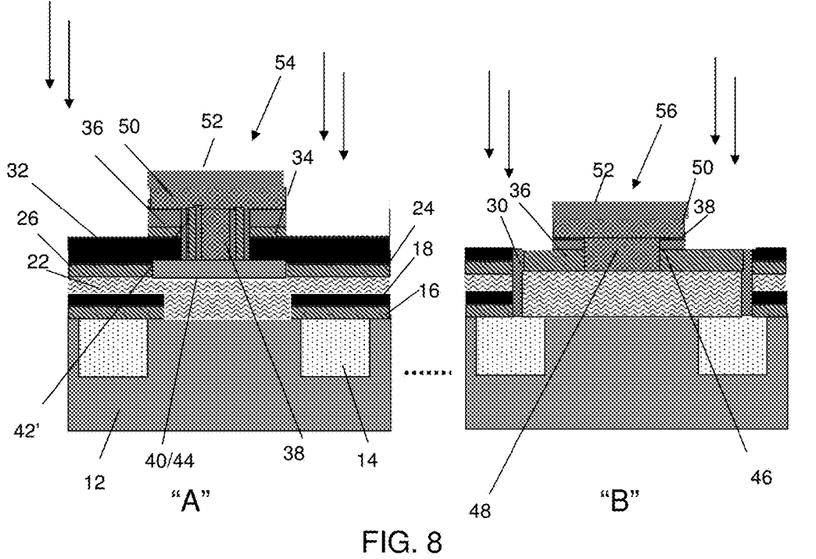
FIG. 8 shows emitters for the first device and the second device and respective fabrication processes in accordance with aspects of the present disclosure.

As shown in FIG. 8, the oxide material (e.g., oxide material 46) is removed from the opening 38 (and other surfaces), followed by deposition of emitter material 50 in both the openings 38 and 48. In embodiments, the emitter material 50 can be in-situ doped polysilicon e.g., arsenic or phosphorous doped polysilicon. A nitride material 52 is formed over the emitter material 50. In embodiments, the emitter material 50 and nitride material 52 can be deposited by a conformal deposition process, e.g., CVD, followed by a patterning process to simultaneously form the emitter 54 of the LNA device and the emitter 56 of the PA device. The patterning process can be a conventional lithography and etching process, as described herein, to form the emitter 54 of the LNA and the emitter 56 of the PA.

Still referring to FIG. 8, the structures then undergo an implant process to form the NPN structures. In embodiments, the implant process is a P+ implant, e.g., boron. The implant can have a dose of greater than 1E14. In addition, in embodiments, Ge or carbon can be added to reduce the diffusion of boron. The processes continue with an extrinsic base contact and collector contact for both LNA device and PA device using a same etching process (e.g., same mask for both the devices).

Accordingly, as should now be understood by those of skill in the art, the methods described herein form two SiGe epitaxy base profiles by growing the first SiGe base with nonselective epitaxy, depositing a sacrificial base oxide layer and poly-Si or a-Si layer and opening a window for second-type NPN (e.g., PA device). The method further comprises growing a second SiGe base, forming an emitter window for the first-type NPN (e.g., LNA device), and etching a cavity or undercut for selective epitaxy to link the extrinsic base to intrinsic base for the first-type NPN. An emitter window can be formed for the second-type NPN, e.g., PA device, with the emitter being formed for both types of NPNs, e.g., PA and LNA, simultaneously. In embodiments, the intrinsic base epitaxy for the second type device, e.g., PA, can be an extrinsic base for the first type device, e.g., LNA.

In addition, the following features are provided as shown in Table 1, below.

TABLE 1

|  | 1st HBT device (e.g., LNA Device) | 2nd HBT device (e.g., PA Device) |
| --- | --- | --- |
| Emitter/base integration | Self-aligned | Non-self-aligned |

TABLE 1-continued

| | 1st HBT device (e.g., LNA Device) | 2nd HBT device (e.g., PA Device) |
|---|---|---|
| Extrinsic Base | Si seed layer + Implanted 2nd HBT device SiGe base | Implanted 2nd HBT device SiGe base |
| SiGe Intrinsic Base | Non-selective SiGe (or other semiconductor material) epitaxy (1) | Non-selective SiGe (or other semiconductor material) epitaxy (2) |
| Collector | Dedicated SIC implant (or shared with 2nd HBT device) | Dedicated implant |
| Emitter | Shared with 2nd HBT device | Shared with 1st HBT device |
| Sub-collector | Shared with 2nd HBT device | Shared with 1st HBT device |

Figure 9:
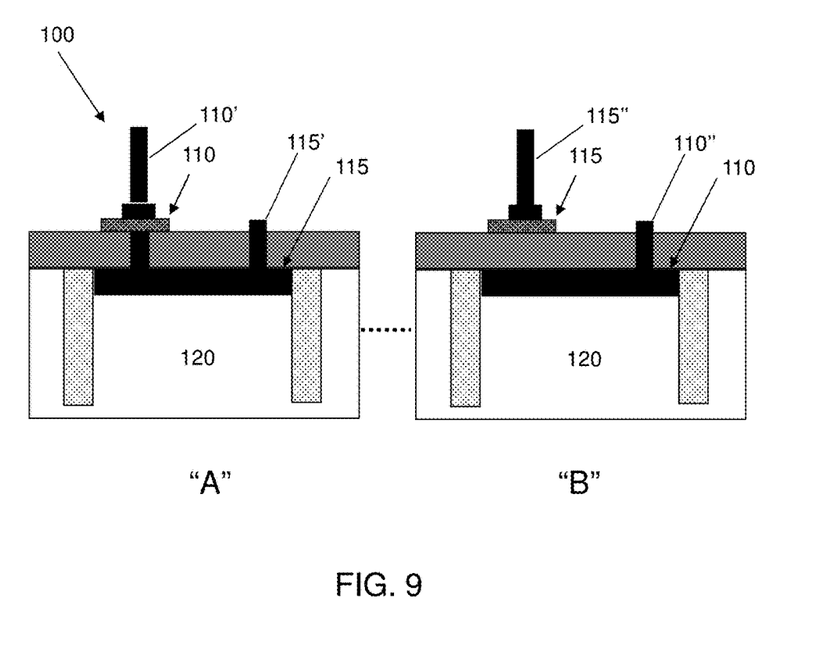
FIG. 9 shows two HBT devices with respective contacts and fabrication processes in accordance with aspects of the present disclosure.

FIG. 9 shows two HBT devices with respective contacts and fabrication processes in accordance with aspects of the present disclosure. More specifically, the structure 100 of FIG. 9 shows an emitter up device on side "A" and a collector up device on side "B". In embodiments, the emitter up device includes an emitter region 110 above the substrate 120, with the collector region 115 within the substrate 120; whereas, the collector up device includes the emitter region 110 within the substrate 120 and the collector region 115 above the substrate 120. In embodiments, the emitter up device has a self-aligned emitter and base region and the collector up device has a non-self aligned collector and base region. The emitter regions, collector regions and remaining structures of the structure can be fabricated in the manner already described herein such that no further explanation is required for one of skill in the art to understand the fabrication processes.

Still referring to FIG. 9, in the emitter up device, a contact 110' is contacting the emitter region 110 above the substrate 120, with a contact 115' contacting the collector region 115 on a side of the emitter region 110. Similarly, in the collector up device, a contact 115" is contacting the collector region 115 above the substrate 120, with a contact 110" contacting the emitter region 110 on a side of the collector region 115. The contacts 110', 110", 115' and 115" can be fabricated with conventional lithography, etching and deposition processes as already described herein such that that no further explanation is required for one of skill in the art to understand the fabrication processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising at least two heterojunction bipolar transistor (HBT) devices integrated onto a same wafer with different epitaxial base profiles, wherein an intrinsic base epitaxy for a second device of the at least two HBT devices acts as an extrinsic base for a first device of the at least two HBT devices, and
the first device and the second device of the at least two HBT devices have a same emitter material and an insulator material is deposited directly over a top surface of the same emitter material for the first device and the second device.

2. The structure of claim 1, wherein the different epitaxial base profiles are two different SiGe epitaxy base profiles.

3. The structure of claim 1, wherein the at least two HBT devices include a power amplifier and a low noise amplifier.

4. The structure of claim 1, wherein semiconductor material is formed in an undercut to link a raised extrinsic base to an intrinsic base on the first device.

5. The structure of claim 4, wherein the epitaxy base for the second device is SiGe material and the extrinsic base for the first device is poly material.

6. The structure of claim 1, wherein a first device of the at least two HBT devices includes self-aligned emitter/base integration.

7. The structure of claim 6, wherein the second device of the at least two HBT devices includes a non-self-aligned emitter/base integration.

8. The structure of claim 1, wherein:
the different epitaxial base profiles have different dopant concentrations for the first device and the second device of the at least two HBT devices;
the different epitaxial base profiles have different Ge content for the first device and the second device of the at least two HBT devices; and
the different epitaxial base profiles have different thicknesses for the first device and the second device of the at least two HBT devices.

9. The structure of claim 1, wherein the at least two HBT devices include an emitter up device with a self-aligned emitter and base region and a collector up device with a non-self aligned collector and base region.

10. The structure of claim 1, wherein the at least two HBTs have different collector regions.

11. The structure of claim 1, wherein the same emitter material is phosphorous doped polysilicon and the insulator material is a nitride material deposited over the same emitter material.

12. A structure comprising:
a first heterojunction bipolar transistor (HBT) device formed on a substrate, the first HBT device comprising:
a collector region formed from the substrate;
a self-aligned epitaxial base having a first profile formed in an opening above the collector region; and
a self-aligned emitter region adjacent to the epitaxial base with the first profile;
a second HBT device formed on the substrate, the second HBT device comprising:

a collector region formed from the substrate;

an epitaxial base having a second profile different than the first profile, which is formed in an opening above the collector region; and an emitter region adjacent to the epitaxial base with the second profile, wherein an intrinsic base epitaxy for the second HBT device is an extrinsic base for the first HBT device, and the first HBT device and the second HBT device have a same emitter material and an insulator material is deposited directly over a top surface of the same emitter material for the first HBT device and the second HBT device.

13. The structure of claim 12, wherein the second HBT device includes a non-self-aligned emitter/base integration.

14. The structure of claim 12, wherein the first and second epitaxial base profiles are two different SiGe epitaxy base profiles.

15. The structure of claim 14, wherein the first and second epitaxial base profiles have different dopant concentrations.

16. The structure of claim 14, wherein the first and second epitaxial base profiles have different thicknesses and the first and second epitaxial base profiles have different Ge content.

17. The structure of claim 12, wherein collector region of the first HBT device is different than the collector region of the second HBT device.

18. The structure of claim 12, wherein the epitaxy base for the second HBT device is SiGe material and the extrinsic base for the first HBT device is poly material.

19. A method, comprising:

growing a first SiGe base with non-selective epitaxy to partially form an extrinsic base for a first device;

growing a second SiGe base to form an intrinsic base epitaxy for a second device and another portion of the extrinsic base for the first device, the first SiGe base and the second SiGe base having a different base profile;

forming an emitter window and an undercut for the first device over the first SiGe base;

linking the extrinsic base to an intrinsic base for the first device within the undercut;

forming an emitter window for the second device; and forming an emitter for both the first device and the second device, simultaneously.

* * * * *